(12) United States Patent
Frateschi

(10) Patent No.: US 6,967,770 B2
(45) Date of Patent: Nov. 22, 2005

(54) SEMICONDUCTOR OPTICAL AMPLIFIER WITH REDUCED EFFECTS OF GAIN SATURATION

(75) Inventor: Newton C. Frateschi, Breinigsville, PA (US)

(73) Assignee: T-Networks, Inc., Allentown, PA (US)

( * ) Notice: Subject to any disclaimer, the term of this patent is extended or adjusted under 35 U.S.C. 154(b) by 0 days.

(21) Appl. No.: 10/894,532

(22) Filed: Jul. 20, 2004

(65) Prior Publication Data

US 2004/0263953 A1 Dec. 30, 2004

Related U.S. Application Data

(62) Division of application No. 10/197,107, filed on Jul. 17, 2002.
(60) Provisional application No. 60/336,305, filed on Nov. 2, 2001.

(51) Int. Cl.[7] .............................. H01S 3/00; H01S 5/00
(52) U.S. Cl. ............................ 359/344; 372/45; 372/48
(58) Field of Search ........................... 359/344; 372/45, 372/48

(56) References Cited

U.S. PATENT DOCUMENTS

| 4,939,474 A | 7/1990 | Eisenstein et al. |
|---|---|---|
| 6,268,953 B1 | 7/2001 | Maloney |
| 6,275,329 B1 | 8/2001 | Sieben |
| 6,304,347 B1 | 10/2001 | Beine et al. |
| 6,744,800 B1 * | 6/2004 | Kneissl et al. ................ 372/50 |
| 6,816,528 B1 * | 11/2004 | Kneissl et al. ................ 372/50 |

FOREIGN PATENT DOCUMENTS

FR         2637743 A   *   4/1990   ............. H01S/3/19

* cited by examiner

*Primary Examiner*—Mark Hellner
(74) *Attorney, Agent, or Firm*—RatnerPrestia

(57) ABSTRACT

An active optical device with reduced axial carrier depletion is disclosed. This active optical device includes a substrate layer; a p-doped active layer coupled to the substrate, a semiconductor layer coupled to the active layer, an electrical contact coupled to the substrate layer, and an electrical contact coupled to the semiconductor layer. The p-doped active layer has a central interaction region and a transverse diffusion region. The transverse diffusion region supplies additional carriers to the central interaction region in response to carrier depletion in the central interaction region caused by the interaction of the carriers with a light beam. Also a method of operation and a method of manufacture for the active optical device is disclosed.

15 Claims, 10 Drawing Sheets

SEMICONDUCTOR OPTICAL AMPLIFIER WITH REDUCED EFFECTS OF GAIN SATURATION

CROSS-REFERENCE TO RELATED APPLICATIONS

This application is a divisional of U.S. application Ser. No. 10/197,107, filed Jul. 17, 2002, which claims the benefit of U.S. Provisional Application No. 60/336,305, filed Nov. 2, 2001, the contents of which are incorporated herein by reference.

This invention relates to active optical devices, using bulk or quantum well active structures. More specifically, it relates to ways of improving carrier depletion recovery by enhanced transversal carrier diffusion.

BACKGROUND OF THE INVENTION

A typical semiconductor optical amplifier (SOA) 900, as shown in FIG. 9, is a wave-guide structure with a semiconductor gain medium 106 (either bulk or multi-quantum well), similar to a semiconductor laser. Semiconductor gain medium 106 is sandwiched between a substrate 104 and a semiconductor layer 902. These two layers, 104 and 902, have a lower index of refraction than gain medium 106 and tend to confine the optical mode within gain medium 106, as does passivation layer 114. Passivation layer 114, which is generally formed of an insulating dielectric material, serves to protect the waveguide and substrate surfaces and reduce surface leakage currents, as well as to act as a cladding layer. Contact layer 904 desirably provides reduced contact resistance with contact 906 and provides a ready supply of carriers to be pumped into gain medium 106 during operation giving rise to a population inversion. Stimulated radiative recombination of carriers in gain medium 106 leads to coherent amplification of optical signals passing through the SOA. The ends of the wave-guide are usually treated to avoid optical feedback. This treatment may include, for example applying an antireflection coating, or forming a tilted mirror, buried facet, etc. Therefore, an SOA operates as a traveling wave amplifier with its gain controlled by current injection from contact layer 904.

In order to achieve high gain and low power drive, the devices have a wave-guide mode, which defines an interaction region 908 of amplification layer 106. Interaction region 908 has a width matched to mesa width 120. The contact layer 904 and the electrical contact 906 also match this width so that current injection is ensured across the full mesa width. If the desired amplification outpaces the rate at which carriers may be pumped into interaction region 908, carrier depletion within the interaction region may result, reducing the gain of the SOA.

One important limitation of these amplifiers in high-speed optical communications systems is the axial carrier depletion induced by the leading edges of pulses, which results in undesired pulse distortion and self phase modulation. This carrier depletion may additionally vary along the length of the SOA, which may lead to further distortion of the output optical signal. To avoid this distortion, stringent output power limits have generally been imposed, limiting the applications of SOA's. Thus, a technique or design that reduces carrier depletion may be very desirable.

In U.S. Pat. No. 4,939,474, Eisenstein et al. disclose an SOA with shortened gain-recovery time. In the disclosed SOA, an amplification layer, which is either undoped or lightly n-doped, has an interaction region and a carrier-storage region adjacent to the interaction region of the amplifier. Passage of carriers from the storage region to the gain region is used to replenish the carrier population within the gain region, thereby permitting recovery of the amplifier gain. This method provides somewhat decreased carrier depletion in the interaction region due lateral diffusion of carriers within the amplification layer. The rate of gain-recovery is largely determined by the diffusion rate for holes in the amplification layer, as holes generally diffuse much more slowly than electrons.

SUMMARY OF THE INVENTION

One embodiment of the present invention is an active optical device with reduced axial carrier depletion. This active optical device includes a substrate layer; a p-doped active layer coupled to the substrate, a semiconductor layer coupled to the active layer, an electrical contact coupled to the substrate layer, and an electrical contact coupled to the semiconductor layer. The p-doped active layer has a central interaction region and a transverse diffusion region. The transverse diffusion region supplies additional carriers to the central interaction region in response to carrier depletion in the central interaction region caused by the interaction of the carriers with a light beam.

Another embodiment of the present invention is a method for minimizing pulse shape distortion and chirp of an optical signal amplified by a semiconductor optical amplifier (SOA) which includes a p-doped active layer. The optical signal is coupled into, and substantially confined within an amplification region of the p-doped active layer of the SOA. The optical signal is amplified by a plurality of carriers within the amplification region of the SOA. Pulse shape distortion and chirp of the amplified optical signal are minimized by supplying additional electrons from a transverse diffusion region of the p-doped active layer to the amplification region, thereby reducing carrier depletion within the amplification region.

A further embodiment of the present invention is a method of manufacturing an active optical device having reduced carrier depletion within a p-doped active layer. A substrate layer is provided and the p-doped active layer is formed on the top surface of the substrate layer. A semiconductor layer is formed on the p-doped active layer. The p-doped active layer and the semiconductor layer are defined and etched to form a mesa structure, exposing portions of the top surface of the substrate. The semiconductor layer is further defined and etched to form a ridge structure within the mesa structure. A dielectric protection layer is formed over the exposed portions of the substrate and the portions of the mesa walls formed in the p-doped active layer. A contact layer is formed over the semiconductor layer and electrical contacts are formed on the semiconductor layer.

BRIEF DESCRIPTION OF THE FIGURES

The invention is best understood from the following detailed description when read in connection with the accompanying drawing. It is emphasized that, according to common practice, the various features of the drawing are not to scale.

On the contrary, the dimensions of the various features are arbitrarily expanded or reduced for clarity. Included in the drawing are the following figures.

DETAILED DESCRIPTION OF THE INVENTION

The present invention in embodied in an active optical device in which lateral transverse electron diffusion is enhanced to mitigate axial electron depletion within the active layer of the device. The effects of axial hole depletion are reduced by forming the active layer in a relatively highly doped p-type material. It is contemplated that the active layer may be composed of a bulk material or may be a quantum well structure.

Figure 1:
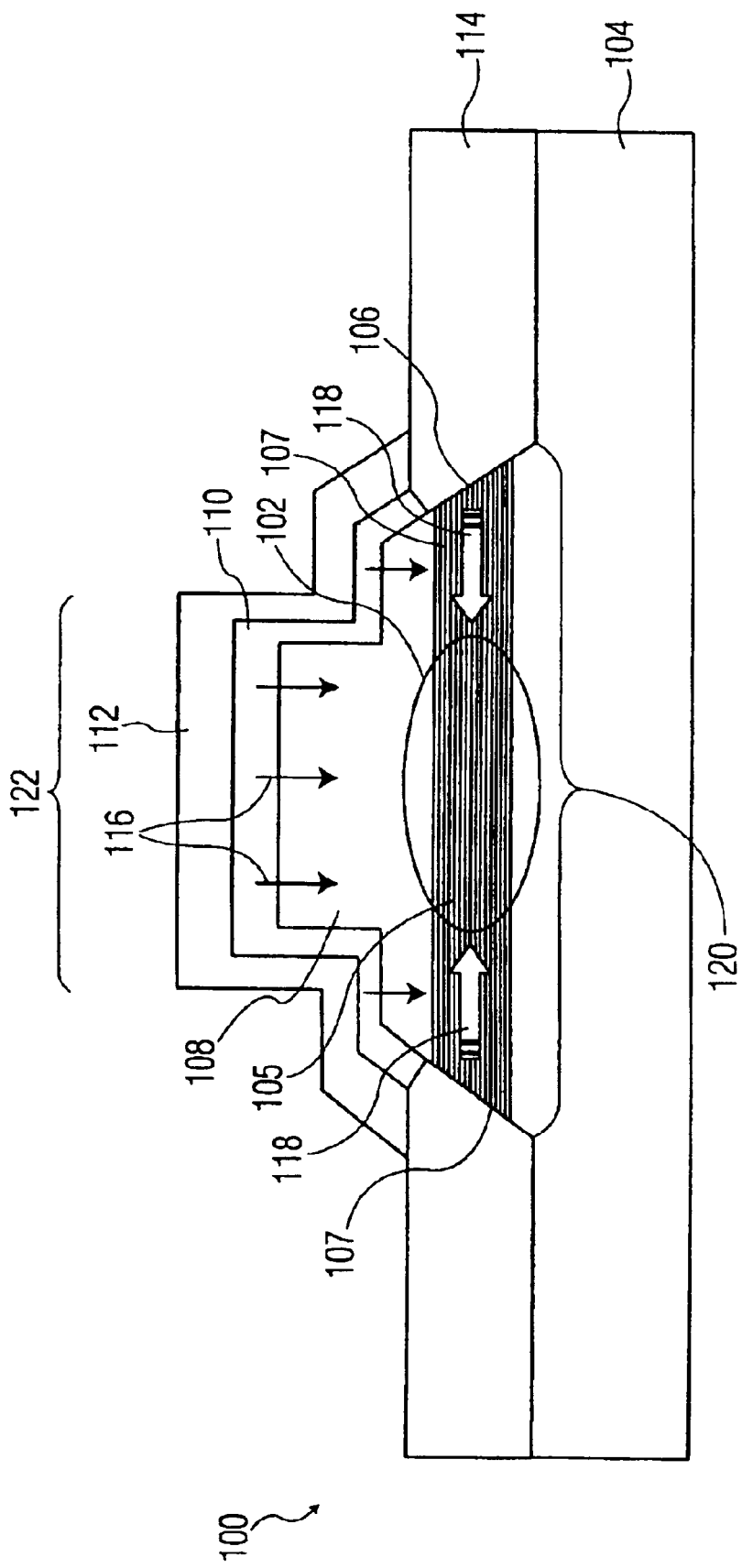
FIG. 1 is a side-plan drawing of an exemplary active optical device according to the present invention.

FIG. 1 illustrates an exemplary active optical device 100 of the present invention. This exemplary device is designed such that the transverse profile of the single wave-guide mode 102 is smaller than the current injection area. The exemplary structure includes a ridge wave-guide structure 122 disposed over a wider mesa 120. Electrical signals are coupled into the device through electrical contact layer 112 and a substrate contact (not shown). Current injection from semiconductor contact layer 110 (illustrated by arrows 116) to p-type active layer 106 is performed both on the ridge and the mesa such that the entire active layer undergoes population inversion. Ridge 122 creates an effective refractive index step, desirably confining the lateral guided optical mode 102, as shown, to a central interaction region 105 of p-type active layer 106 which is narrower than the full width of active layer 106. For example, central interaction region 105 may include the center half of active layer 106. The remaining, outside, portions of active layer 106, diffusion regions 107, act as carrier reservoirs, providing electrons, and holes, to reduce carrier depletion in central interaction region 105. Substrate layer 104 and semiconductor layer 108 are preferably selected to have indices of refraction lower than that of p-type active layer 106 to mostly confine optical mode 102 vertically within the p-type active layer. P-type active layer 106 is doped at a relatively high level, between about $1 \times 10^{17}$ and about $2 \times 10^{18}$. It is desirable that the doping level of p-type active layer 106 is high enough to provide an abundance of holes, but not so high that scattering losses due to the dopants unduly affect performance of the active optical device. Also, it is desirable for the doping of p-type active layer 106 be selected to prevent excessive recombination at the junction of semiconductor layer 108 and the p-type active layer.

Substantial interaction between p-type active layer 106 and the electromagnetic field of optical mode 102 occurs only within interaction region 105 of active optical device 100, which causes carrier depletion to occur in the region 105. This carrier depletion affects the operation of the device and may prove undesirable at high intensities. The present invention may reduce carrier depletion within interaction region 105 by lateral diffusion of electrons within the p-type active layer 106. By doping the active region as a p-type region, mostly electrons are pumped into the active region during operation. Because electrons generally have a diffusion coefficient about 100 times greater than holes, compensation of carrier depletion may be efficiently accomplished.

Lateral diffusion regions 107 of the p-type active layer desirably act as an electron reservoir. The effect of this electron reservoir on electron concentration in interaction region 105 of the p-type active layer may be modeled by an additional driving term $D\nabla^2 n$, where n is the excess electron concentration in lateral diffusion regions 107 and D is the electron diffusion coefficient within the p-type active layer. The results of this driving term, depicted by lateral arrows 118 in FIG. 1, allow device 100 to compensate for a portion of the electron depletion in interaction region 105. The doping level of the p-type active layer is desirably selected to provide an abundance of holes, even for higher optical intensities. Therefore, hole depletion in interaction region 105 is desirably reduced by the relatively high doping level of p-type active layer 106 and electron depletion in interaction region 105 is reduced by compensating lateral electron diffusion from lateral diffusion regions 107. Lateral hole diffusion from lateral diffusion regions 107, though slower than lateral electron diffusion, may further help to reduce hole depletion in interaction region 105, particularly for light hole states, which diffuse more rapidly than heavy hole states.

Several different exemplary active optical devices, such as semiconductor optical amplifiers (SOA's), diode lasers, electroabsorption modulators (EAM's), and variable optical attenuators (VOA's), may be constructed to take advantage of the exemplary structure illustrated in FIG. 1. Reduced electron depletion in the interaction region may provide any of these exemplary active optical devices with a number of advantages. It is understood by one skilled in the art that other exemplary optical devices may be produced using methods and structures similar to those described below with reference to the exemplary SOA's.

One exemplary embodiment is as an SOA which may desirably amplify pulses in an optical signal with minimum harmonic distortion and chirp. Unwanted harmonic distortion and chirp may be caused by carrier depletion in the gain material (active layer) of an SOA. As described above, the forward edge of a pulse may receive significantly increased amplification, distorting the pulse shape and leading to harmonic distortion and chirp. Also, significant changes in carrier concentration may alter the index of refraction in the gain material. These effects may be more pronounced for higher intensity input signals and/or SOA's operating at higher gains. Additionally, faster bit rate signals and shorter pulses may exacerbate these problems.

Exemplary electron refilling times of 1 ps for the central amplification region may allow for substantially reduced distortion of harmonic pulses having frequencies in excess of 40 GHz. Specific electron refilling times may be affected by the selection of materials and the widths of the ridge and mesa. An exemplary SOA may be designed to provide a desired electron refilling time. Therefore, the use of lateral electron diffusion (and to some extent lateral hole diffusion) from a carrier reservoir in transverse diffusion regions 107, as illustrated by arrows 118 in FIG. 1, coupled with the surplus of holes in relatively highly doped p-type active layer 106, which reduce carrier depletion in central amplification region 105, may minimize harmonic distortion and chirp, while at the same time increasing the maximum gain and maximum effective bit rate of the exemplary SOA.

Another embodiment of the structure illustrated in FIG. 1 is an exemplary diode laser, which includes lateral electron diffusion as in the exemplary SOA described above. Standing wave patterns in both Fabry-Perot and distributed feedback diode lasers may lead to significant spatial hole burning within the gain medium, thereby limiting performance of these lasers, particularly for single-mode operation. Single-mode operation is often desirable due to its advantages in terms of noise and spectral bandwidth of the laser.

Reduced carrier depletion in the gain medium of the exemplary laser desirably leads to decreased spatial hole burning. The reduction of spatial hole burning due to lateral electron diffusion in transverse junction stripe lasers using only electron injection was disclosed by W. Streifer et al. in "Dependence of longitudinal mode structure on injected carrier diffusion in diode lasers," IEEE Journal of Quantum Electronics, vol. 13, pp. 403–404, June 1977, and is herein incorporated by reference.

An exemplary diode laser with a p-type active layer and an exemplary mesa and ridge structure as shown in FIG. 1 may exhibit reduced carrier depletion with both electron and hole injection. By reducing carrier depletion and, thus, spatial hole burning, the exemplary diode laser may provide a greater maximum output power for single-mode operation, but such a design may increase the lasing threshold of the exemplary laser as well. Decreased spatial hole burning may also lower noise caused by mode competition in the exemplary diode laser during multi-mode operation.

Other embodiments of the present invention include exemplary EAM's or VOA's. In these exemplary devices optical signals are absorbed by carriers in the p-type active layer of the device. Carrier depletion may reduce the absorptivity of the absorption material in the active layer. Also, carrier depletion may alter the refractive index of the absorption material. In a VOA, the resulting problems with pulse shape distortion, harmonic distortion, and chirp are similar to those encountered in an SOA. In the extreme, a sufficiently intense signal may bleach the material leading to signal distortion in an EAM as well as possible problems with pulse shape distortion, harmonic distortion, and chirp. An exemplary EAM or VOA with increased lateral electron diffusion may exhibit decreased pulse shape distortion, harmonic distortion, and chirp due to reduced carrier depletion. Reduced carrier depletion in exemplary EAM's and VOA's from a mesa and ridge structure, as shown in FIG. 1, may also increase the maximum signal extinction possible in these devices. These advantages of the exemplary EAM's and VOA's may prove particularly useful for manipulating optical signals which have relatively high intensities, relatively high bit rates, relatively short pulses, or a combination thereof.

Figure 2:
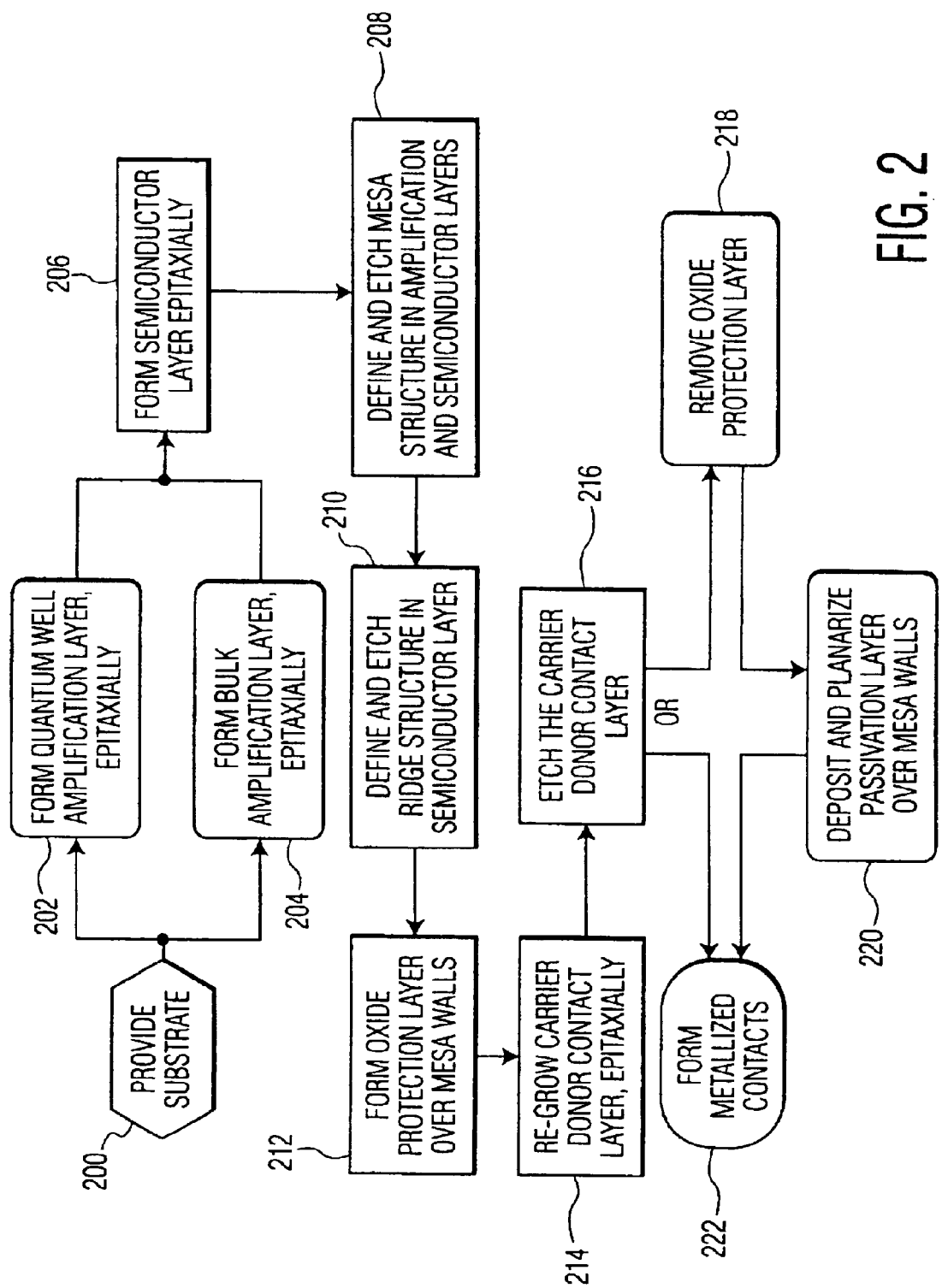
FIG. 2 is a flowchart illustrating an exemplary method of manufacture of an exemplary SOA according to the present invention.

FIG. 2 is a flowchart illustrating fabrication steps for an exemplary SOA of the present invention. FIGS. 3–8 illustrate various steps in this exemplary fabrication process.

Figure 3:
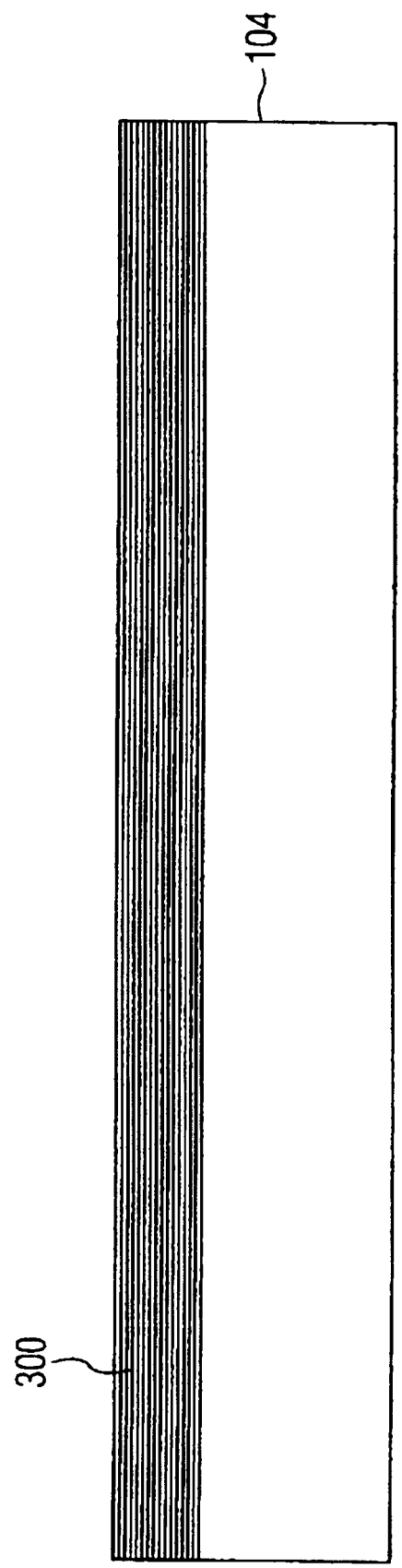
FIGS. 3, 4, 5, 6, 7A, 7B, and 8 are side-plan drawings of an exemplary SOA during manufacture according to the flowchart of FIG. 2.

First, a substrate, element 104 in FIG. 3, is provided, step 200. The substrate may be a single layer semiconductor material, preferably a III/V composition such as GaAs, InP, InGaAsP, AlGaAs, or InSb. The substrate may serve several functions in the exemplary SOA, including mechanical support, electrical contact, and a cladding layer to help confine the optical mode in the active layer. Alternatively, substrate 104 may be a multiple sub-layer structure. These sub-layers may include silicon, alumina, III/V materials, germanium, and other semiconductor materials. Electronic structures may be formed within these sub-layers to assist in control of the exemplary SOA.

A p-type amplification layer, element 300 in FIG. 3, is formed on top of the substrate, alternative steps 202 and 204. The p-type amplification layer which is formed may be either a quantum well structure, step 202, or a bulk gain material, step 204. The p-type amplification layer is desirably formed of p-type III/V materials selected to form a heterojunction with the substrate layer. Specific composition of the group III and group V compounds may be selected to provide desired optical gain and confinement for an optical signal of a selected wavelength. This layer is desirably approximately 0.2–0.3 $\mu$m thick.

Alternatively, a quantum well structure may be formed within the p-type amplification layer in the same way that a quantum well structure is formed within an n-type III/V material layer. The thickness of the quantum well sub-layers is based on the energies of the holes and/or electrons to be confined within the layers and also upon the particular material composition selected, but are desirably of a proper dimension so that quantum confinement in the vertical direction is present. In GaAs, for example, the thickness of the quantum well sub-layers may be between about 4 nm and about 40 nm.

Quantum well structures have been shown to be capable of preferentially confining light hole states or heavy hole states. Light hole states laterally diffuse more rapidly than heavy hole states. Therefore, the quantum well sub-layers may desirably be sized, and their material compositions selected, to confine light holes, which may improve the response time of the quantum well structure of the p-type amplification layer. Alternatively, the specific confinement of either light or heavy hole states may be desirable to provide polarization sensitivity. Heavy hole states tend to interact preferentially with the $T_e$ mode of the optical signal and light hole states tend to interact preferentially with the $T_m$ mode of the optical signal.

The p-type amplification layer may, for example, be grown by an epitaxial technique such as liquid phase epitaxy (LPE), metal organic chemical vapor deposition (MOCVD), molecular beam epitaxy (MBE), or chemical beam epitaxy (CBE). FIG. 3 illustrates the exemplary SOA at this stage of fabrication.

Figure 4:
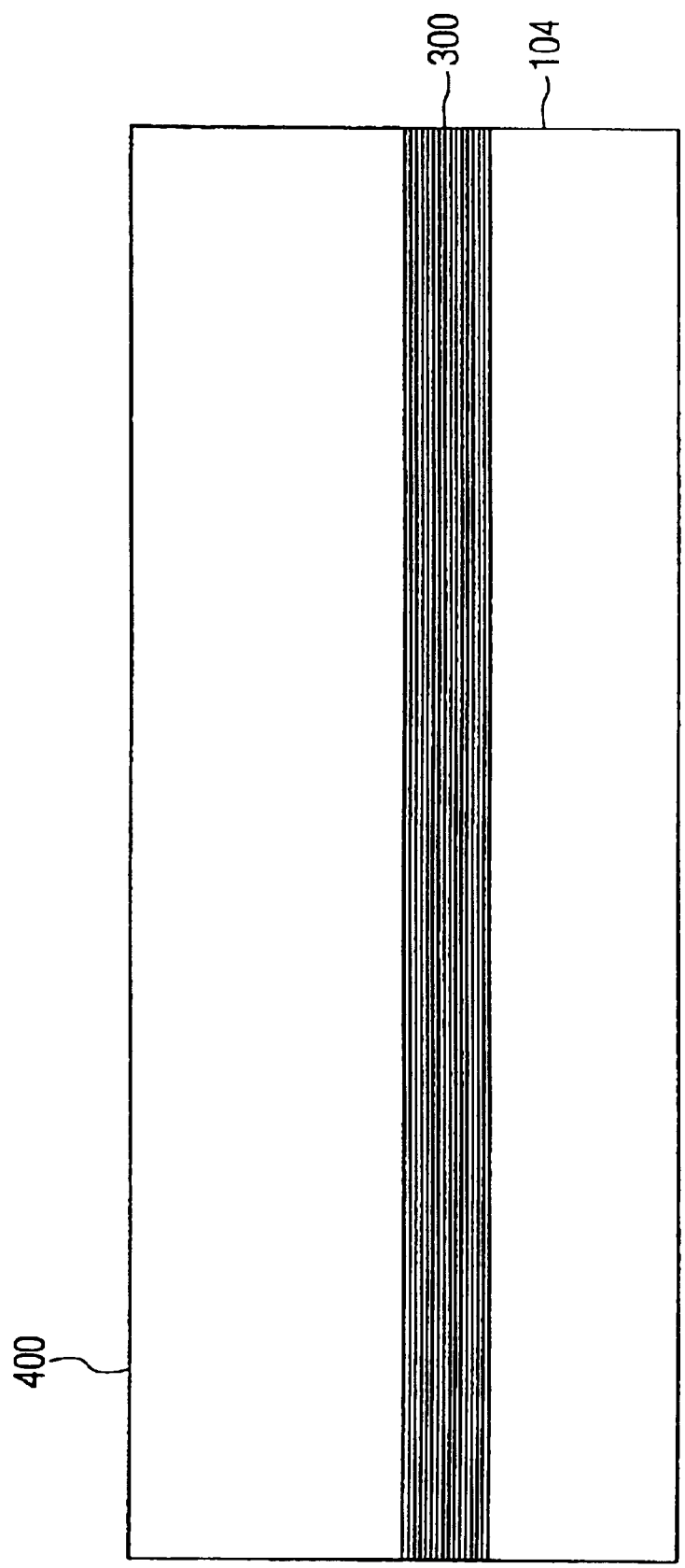

Semiconductor layer 400 is then formed, step 206. An in-process exemplary SOA following step 206 is illustrated in FIG. 4. The semiconductor layer may be formed of a III/V material similar to the material of substrate layer and forms a second heterojunction with the p-type amplification layer. The material composition of this layer also desirably provides a lower index of refraction than the index of refraction of the amplification layer, thereby ensuring significant optical confinement within the amplification layer for an optical signal at the selected wavelength. Semiconductor layer 400 may also have a wider band gap to improve confinement of the injected carriers within the p-type amplification layer. The semiconductor layer may alternatively be formed of multiple sub-layers desirably selected to shape the confined optical mode. These sub-layers may include different semiconductor materials such as silicon, alumina, III/V materials, and germanium. Semiconductor layer 400 preferably may be grown by an epitaxial technique such as LPE, MOCVD, MBE, or CBE, similar to the techniques used to form amplification layer 300. Using the same growth method for both of these layers may be desirable to simplify manufacture, but it is not necessary.

Figure 5:
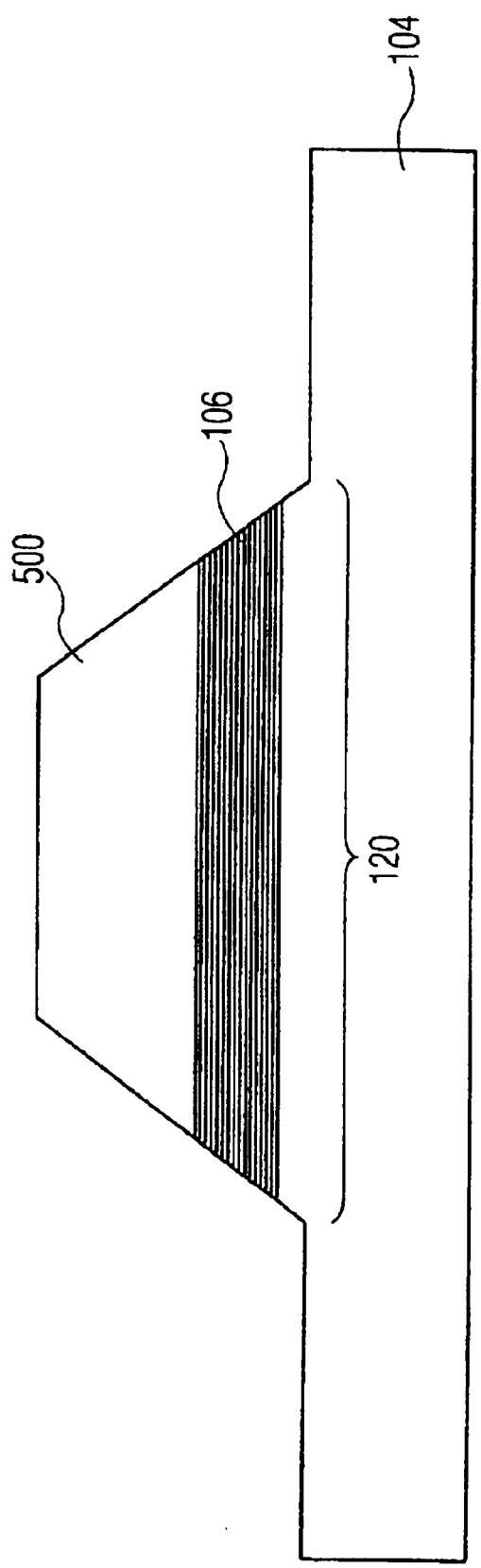

Next, the mesa structure 120 is defined and etched, step 208. This structure includes etched portions of p-type amplification layer 106 and semiconductor layer 500. Although any standard semiconductor etching technique may be employed, a reaction limited, planar dependent wet etch may be preferable. The mesa walls are typically etched to form a trapezoidal mesa cross-section, preferably having approximately 54.7° mesa sides (the angle between the (0,1, −1) plane and the (1,1,1) plane of crystalline GaAs), with a height and median width of approximately 2–5 $\mu$m. The exact geometry used depends on the specific optical mode and carrier distribution desired. An exemplary side-plan view of the structure following step 208 is shown in FIG. 5.

Figure 6:
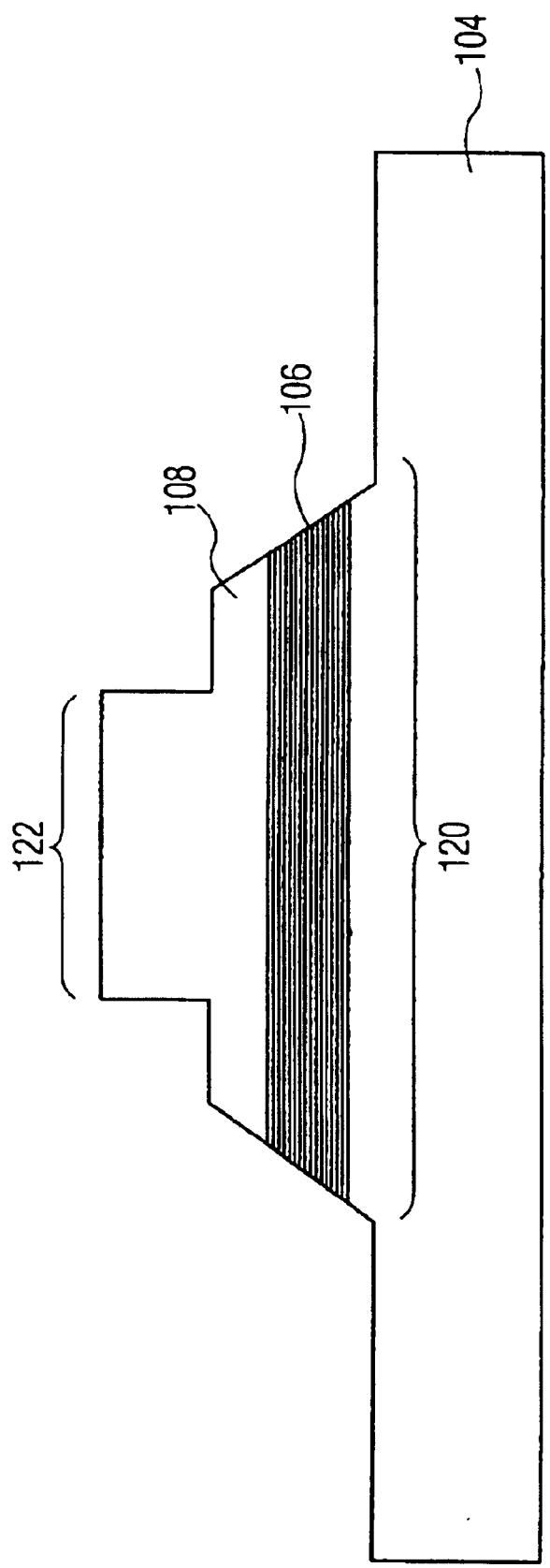

Ridge structure 122 may then be defined and etched, step 210, in the mesa etched semiconductor layer 500 to form the final semiconductor layer 108. The exact size of the ridge depends on the specific optical mode and carrier distribution desired, but preferably the width of will range from 60–90% of the median width of the mesa and the height will be 50–90% the height of the mesa. The ridge structure is preferably formed by a dry anisotropic etching technique, though a wet etching technique may be used as well. The resulting cross-section is illustrated in FIG. 6.

Figure 7A:
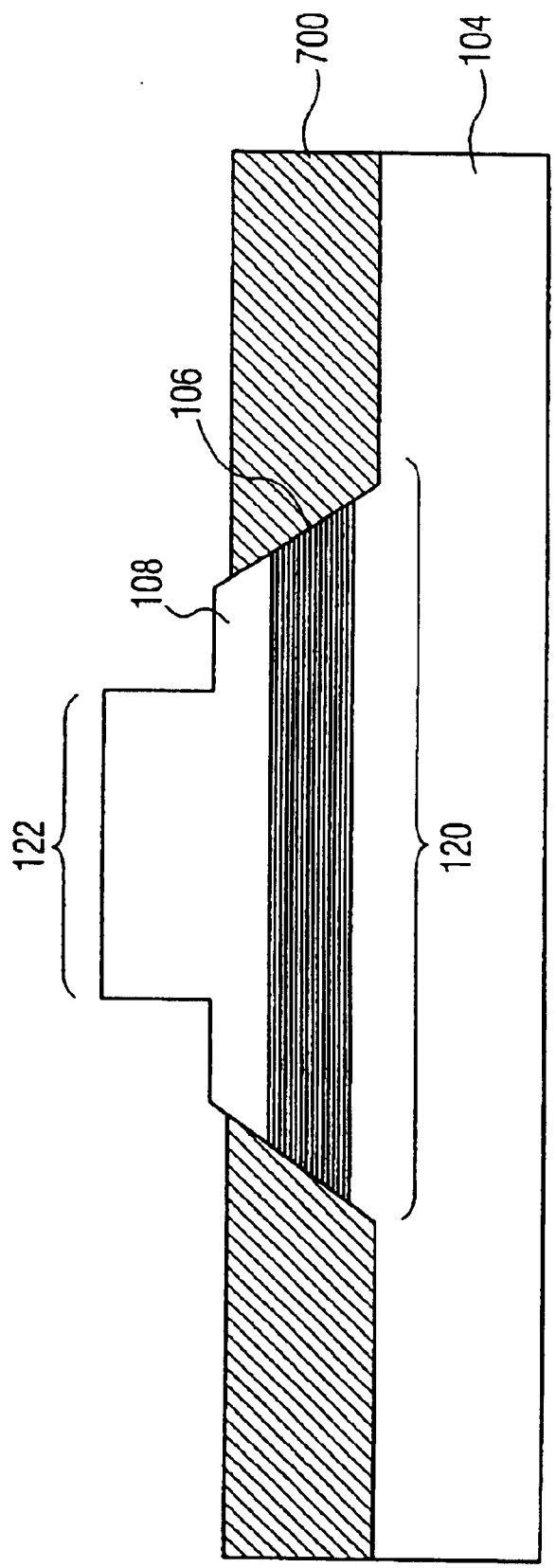

Next, dielectric protection layer 700 is formed over the mesa walls, step 212. FIG. 7A illustrates the process following step 212. This layer may be formed of $SiO_2$, SiN, polyimide, or another insulating material using sputtering, evaporation, or other standard deposition techniques. This dielectric protection layer desirably covers the exposed edges of the p-type amplification layer, while leaving most of the semiconductor layer uncovered. The patterning of dielectric protection layer 700 may be achieved either by masking the regions to remain exposed before deposition, or by selectively etching dielectric protection layer 700 after deposition to expose those regions.

In one exemplary embodiment dielectric protection layer 700 may be used as passivation layer 114 in the completed SOA. In this embodiment, it is desirable for the material of dielectric protection layer 700 to have a lower index of refraction than the mesa materials to improve optical confinement within the p-type amplification layer. It may also be desirable to planarize dielectric protection layer 700.

Contact layer 110 is formed over the semiconductor layer, using, for example, an epitaxial re-growth technique, step 214. It is contemplated, however, that any of the previously mentioned epitaxial methods may be employed. The contact layer is formed of a p-type semiconductor material, preferably a $p^{++}$-doped III/V material selected to be lattice matched to the semiconductor layer. As described above, p-type material is used in the amplification layer to create an excess population of holes in the interaction region. Supplying the p-type amplification layer with a greater surplus of holes means that any effects of carrier depletion in the interaction region occur first for electrons. This is desirable due to the slower diffusion rate of holes. The higher diffusion rate of electrons allows for a faster refilling rate from lateral diffusion in an exemplary SOA according to the present invention. Therefore, electrons are pumped into from contact layer to provide population inversion.

The contact layer material may desirably grow only on the exposed mesa and ridge surfaces, and not on the material of the dielectric protection layer.

Contact layer 110 may be etched, using wet etch techniques, to remove material which does adhere to dielectric protection layer and to pattern the contact layer thickness to enhance the hole injection during operation, step 216.

Figure 7B:
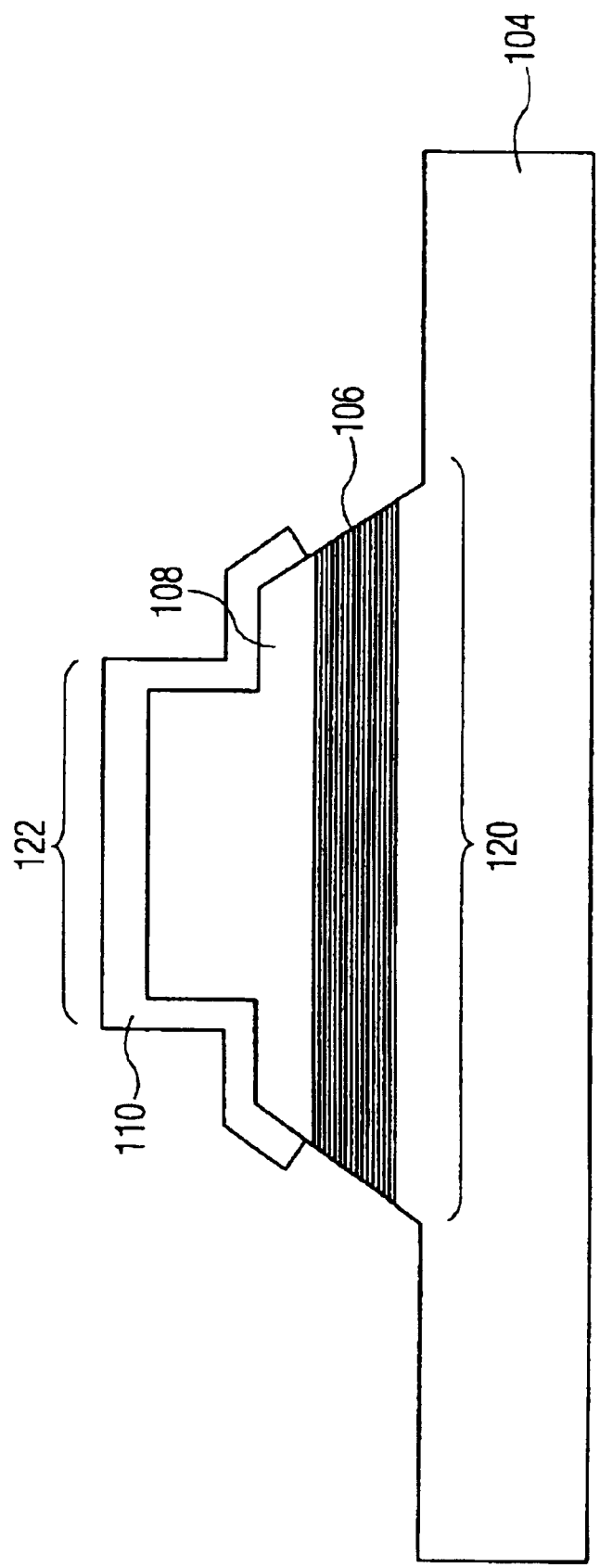

If dielectric protection layer 700 is being used as passivation layer 114, then the process moves to step 222, otherwise the dielectric protection layer may be removed, step 218, preferably using a wet etching technique. FIG. 7B illustrates the process following this step.

Once the dielectric protection layer has been removed (if it is being removed), it may be replaced with passivation layer 114 to cover the exposed mesa walls of the p-type amplification layer, step 220. The passivation layer may be formed of any insulating material with an index of refraction low enough to promote optical confinement within p-type amplification layer 106, such as polyimide, $SiO_2$, SiN, or alumina. Passivation layer 114 may be formed using any of the previously described deposition methods. Alternatively, passivation layer 114 may be formed of undoped III/V material, such as InGaAsP, using an epitaxial re-growth technique. An InGaAsP passivation layer may be desirable to produce an SOA waveguide that has reduced polarization sensitivity. After deposition the passivation layer may be planarized.

Figure 8:
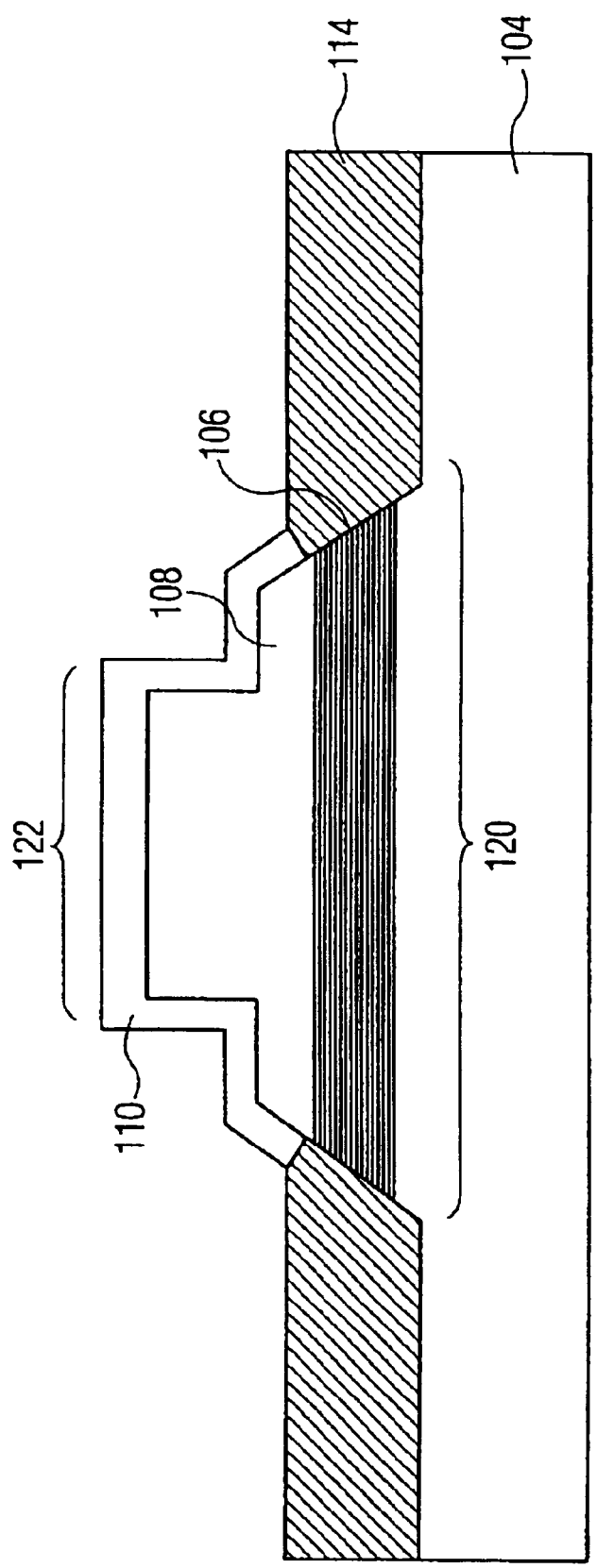
Figure 9:
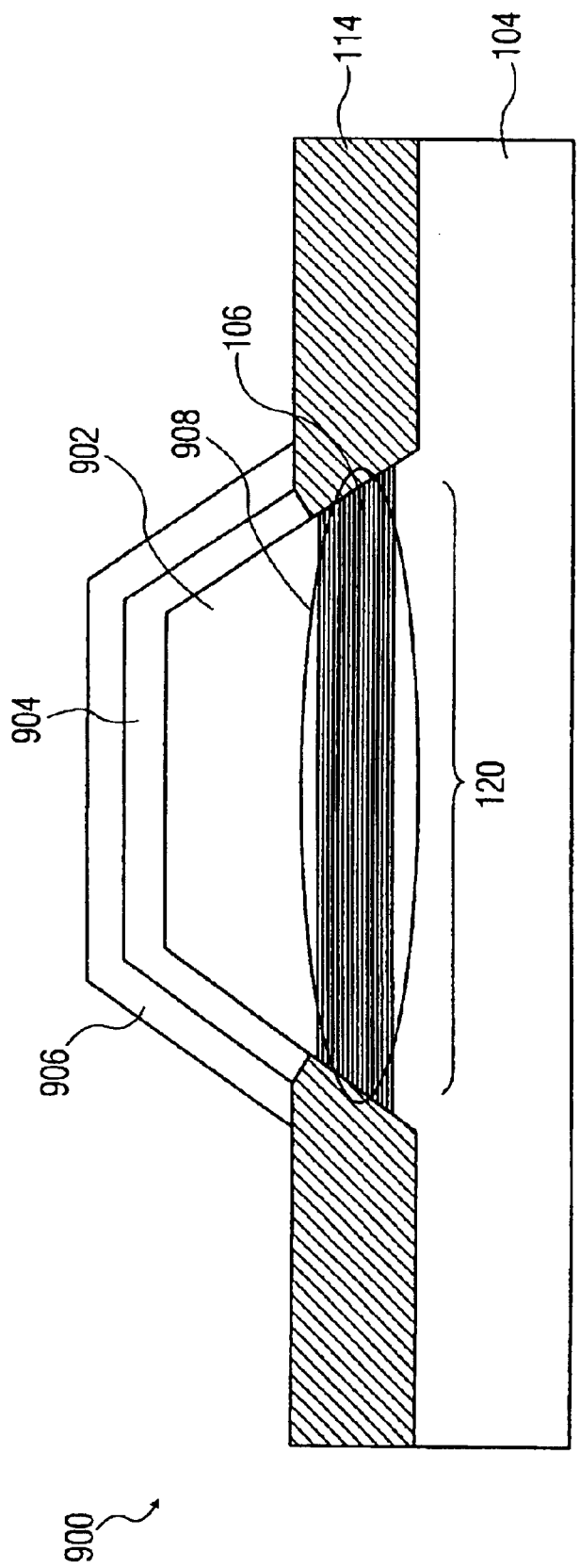
FIG. 9 is a side-plan drawing of a prior art SOA.

FIG. 8 illustrates the in-process SOA before electrical contact layer 112 is formed over contact layer 110, step 222. Electrical contact layer 112 may be formed using a standard deposition technique such as sputtering or evaporation. Electrical contact layer 112 is preferably formed from a conductive material such aluminum, gold, silver, copper, nickel, titanium, tungsten, platinum, beryllium, germanium, polyaniline, polysilicon or a combination of these materials. Patterning may be achieved by masking, etching, or the selection of a conductive material that does not adhere to the passivation material. FIG. 1 illustrates a completed SOA formed by the exemplary process of the flowchart of FIG. 2.

It is contemplated that the exemplary process illustrated in the flowchart of FIG. 2 may also be employed to form other active optical devices with reduced carrier depletion in their active regions such as VOA's, EAM's, and semiconductor lasers. The fabrication steps do not change, only the selection of materials may change so as to optimize the electro-optical characteristics of p-type active layer 106 for the type of active optical device to be formed.

The method illustrated in FIG. 2 may also be used to form a wafer including numerous similar exemplary active optical devices processed in parallel. The individual active optical devices may then be cleaved from one another at the end of the process. Exemplary device lengths may vary greatly depending on desired characteristics, with a range of 100–1000 $\mu$m being typical.

Additionally, it is contemplated that the ends of an exemplary active optical device may be coated with a single-layer or multi-layer anti-reflective coating to improve optical coupling between these devices and other optical components. These coatings may be formed using standard deposition techniques such as sputtering and evaporation. Other methods for improving optical coupling, such as the formation of tilted mirror, buried facet structures, or the inclusion of beam mode expansion/contraction sections in the waveguide may also be employed with the mesa and ridge structure of the present invention. In the case of an exemplary semiconductor laser, a high-reflectivity dielectric mirror may be added also.

Although the embodiments of the invention described above have been in terms of SOA's, it is contemplated that similar concepts may be practiced with other optical components. Also, it will be understood to one skilled in the art that a number of other modifications exist which do not deviate from the scope of the present invention as defined by the appended claims.

What is claimed:

1. A method of manufacturing an active optical device having reduced carrier depletion within a p-doped active layer, the method comprising the steps of:
    a) providing a substrate layer having a top surface;
    b) forming the p-doped active layer on the top surface of the substrate layer;
    c) forming a semiconductor layer on the p-doped active layer;
    d) defining and etching a mesa structure, including mesa walls, in the p-doped active layer and the semiconductor layer, and exposing portions of the top surface of the substrate;

e) defining and etching a ridge structure in the semiconductor layer;

f) forming a dielectric protection layer over the portions of the top surface of the substrate exposed in step d) and portions of the mesa walls formed in the p-doped active layer;

g) forming a contact layer over the semiconductor layer; and h) forming electrical contacts over the semiconductor layer.

2. The method of claim 1, wherein step (b) includes the step of forming the p-doped active layer by metal organic chemical vapor deposition.

3. The method of claim 1, wherein step (b) includes the step of depositing a plurality of sub-layers to form a quantum well structure.

4. The method of claim 1, wherein the etching of the mesa walls includes etching mesa walls to achieve a trapezoidal cross-section for the mesa structure.

5. A method of manufacturing an active optical device including a substrate layer, a p-doped active layer and a semiconductor layer, the p-doped active layer and the semiconductor layer being successively formed on a surface of the substrate layer, the active optical device having reduced carrier depletion within the p-doped active layer, the method comprising:

forming a mesa structure by etching portions of the p-doped active layer and the semiconductor layer, and by exposing portions of the surface of the substrate layer;

etching portions of the formed mesa structure, corresponding to the semiconductor layer to form a ridge structure within the mesa structure;

forming a dielectric layer over the exposed portions of the surface of the substrate layer, and the etched portions of p-doped active layer;

forming a contact layer over the semiconductor layer; and forming electrical contacts over the semiconductor layer.

6. The method of claim 5, wherein the forming of the mesa structure includes wet etching the semiconductor layer on the p-doped active layer.

7. The method of claim 5, wherein the ridge structure formed within the mesa structure has a width in a range of about 60%-90% of a width of the formed mesa structure.

8. The method of claim 5, wherein the ridge structure formed within the mesa structure has a height in a range of about 50%–90% of a height of the formed mesa structure.

9. The method of claim 5, wherein the forming of the ridge structure includes dry etching the mesa structure.

10. The method of claim 5, wherein the forming of the dielectric layer comprises:

depositing a dielectric material with an index of refraction lower than those of materials forming the mesa structure.

11. The method of claim 5, wherein the forming of the dielectric layer comprises:

forming a dielectric layer on exposed portions of the first surface of the substrate layer and the etched portions of p-doped active layer; and planarizing exposed portions of the dielectric layer.

12. The method of claim 5, wherein the forming of the contact layer comprises:

forming a p-type semiconductor layer on exposed surfaces of the mesa and ridge structures; and etching the p-type semiconductor material to remove any of the p-type semiconductor material adhering to the dielectric layer, and to provide a contact layer having a predetermined thickness.

13. The method of claim 5, further comprising:

forming a single layer coating or a multi-layer anti-reflective coating at respective end portions of the active optical device to prevent optical reflections thereat.

14. A method of manufacturing a semiconductor optical amplifier including a substrate layer, a p-doped active layer and a semiconductor layer, the p-doped active layer and the semiconductor layer being successively formed on a surface of the substrate layer, the semiconductor optical amplifier having reduced carrier depletion within the p-doped active layer, the method comprising:

forming a mesa structure by etching portions of the p-doped active layer and the semiconductor layer, and by exposing portions of the surface of the substrate layer;

forming a ridge structure within the mesa structure by selecting a width and a height of the ridge structure according to a specified optical mode of the active optical device, and etching the ridge structure according to the selected width and the selected height of the ridge structure;

forming a dielectric layer over the exposed portions of the first surface of the substrate layer and the etched portions of p-doped active layer;

forming a contact layer over the semiconductor layer; and forming electrical contacts over the semiconductor layer.

15. A method of manufacturing a semiconductor optical amplifier including a substrate layer, a p-doped active layer and a semiconductor layer, the p-doped active layer and the semiconductor layer being successively formed on a surface of the substrate layer, the semiconductor optical amplifier having reduced carrier depletion within the p-doped active layer, the method comprising:

forming a mesa structure by etching portions of the p-doped active layer and the semiconductor layer, and by exposing portions of the surface of the substrate layer;

forming a ridge structure within the mesa structure by selecting a width and a height of the ridge structure according to a specified carrier distribution of the active optical device, and etching the ridge structure according to the selected width and the selected height of the ridge structure;

forming a dielectric layer over the exposed portions of the first surface of the substrate layer and the etched portions of p-doped active layer;

forming a contact layer over the semiconductor layer; and forming electrical contacts over the semiconductor layer.

* * * * *